(12) United States Patent
Nakamura et al.

(10) Patent No.: US 9,397,247 B2
(45) Date of Patent: Jul. 19, 2016

(54) SEALING FILM FOR SOLAR BATTERY

(75) Inventors: Michio Nakamura, Saitama (JP); Yoshinori Negishi, Saitama (JP)

(73) Assignee: ADEKA CORPORATION, Tokyo (JP)

( * ) Notice: Subject to any disclaimer, the term of this patent is extended or adjusted under 35 U.S.C. 154(b) by 460 days.

(21) Appl. No.: 13/512,471

(22) PCT Filed: Dec. 6, 2010

(86) PCT No.: PCT/JP2010/071847
§ 371 (c)(1),
(2), (4) Date: May 29, 2012

(87) PCT Pub. No.: WO2011/071022
PCT Pub. Date: Jun. 16, 2011

(65) Prior Publication Data
US 2012/0247559 A1 Oct. 4, 2012

(30) Foreign Application Priority Data

Dec. 11, 2009 (JP) ................................. 2009-282121

(51) Int. Cl.
H01L 35/00 (2006.01)
H01L 37/00 (2006.01)
H01L 31/048 (2014.01)

(52) U.S. Cl.
CPC ............. *H01L 31/0481* (2013.01); *Y02E 10/50* (2013.01)

(58) Field of Classification Search
CPC ........................... H01L 31/0481; Y02E 10/50
USPC ........................................................ 136/259
See application file for complete search history.

(56) References Cited

U.S. PATENT DOCUMENTS

| 5,447,576 A | 9/1995 | Willis |
| 6,414,236 B1 | 7/2002 | Kataoka et al. |

(Continued)

FOREIGN PATENT DOCUMENTS

| CN | 1699458 A | 11/2005 |
| JP | 6-169099 A | 6/1994 |

(Continued)

OTHER PUBLICATIONS

Negishi et al., JP 2007-169191 A machine-generated English translation, Jul. 5, 2007.*

(Continued)

*Primary Examiner* — David Karst
(74) *Attorney, Agent, or Firm* — Birch, Stewart, Kolasch & Birch, LLP

(57) ABSTRACT

Provided is a sealing film for a solar battery which has excellent light resistance and heat resistance by preventing yellowing due to the influence of light or heat.
The sealing film for a solar battery, in which 0.05-10 parts by weight of a hindered amine compound having a substructure represented by the following general formula (I):

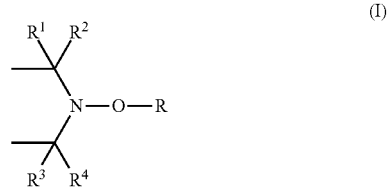

(wherein $R^1$, $R^2$, $R^3$, and $R^4$ each independently represent $C_1$-$C_4$ lower alkyl; and R represents hydrogen, $C_1$-$C_{18}$ straight- or branched-chain alkyl which may be substituted by hydroxy, or $C_5$-$C_8$ cycloalkyl) based on 100 parts by weight of an ethylene-vinyl acetate copolymer is blended.

5 Claims, 1 Drawing Sheet

(56) References Cited

U.S. PATENT DOCUMENTS

| | | | |
|---|---|---|---|
| 6,755,875 B2 * | 6/2004 | Wood et al. | 44/275 |
| 2004/0229404 A1 | 11/2004 | Kiso et al. | |
| 2009/0111699 A1 * | 4/2009 | Negishi et al. | 504/361 |
| 2009/0159129 A1 * | 6/2009 | Kataoka et al. | 136/259 |
| 2009/0165847 A1 * | 7/2009 | Mori et al. | 136/256 |

FOREIGN PATENT DOCUMENTS

| | | | | |
|---|---|---|---|---|
| JP | 8-139347 A | | 5/1996 | |
| JP | 2000-183381 A | | 6/2000 | |
| JP | 2007169191 A | * | 7/2007 | ........... C07D 211/94 |
| JP | 2010-84128 A | | 4/2010 | |
| JP | 2010-280852 A | | 12/2010 | |
| WO | WO 99/27588 A1 | | 6/1999 | |
| WO | WO 2004/031286 A1 | | 4/2004 | |

OTHER PUBLICATIONS

International Search Report issued in PCT/JP2010/071847 dated Mar. 1, 2011.

Chinese Office Action issued in Chinese Patent Application No. 201080056271.9 on Jun. 13, 2014.

Supplementary European Search Report issued Aug. 31, 2015 for PCT Application No. 10835942.3.

Negishi, "Superior Light Stabilization Using a Novel Hindered Amine Light Stabilizer," Addcon World 2007, Sep. 5-6, 2007, Frankfurt, Germany, 8 pages.

Partial Supplementary European Search Report, issued Jul. 3, 2015, for European Application No. 10835942.3.

* cited by examiner

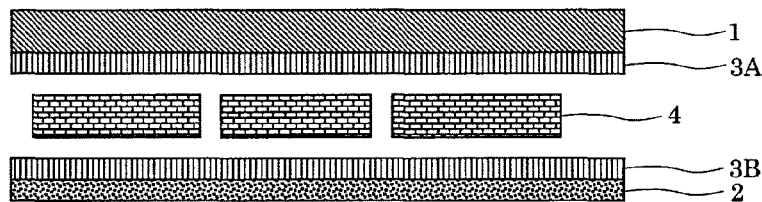

SEALING FILM FOR SOLAR BATTERY

TECHNICAL FIELD

The present invention relates to a sealing film for a solar battery containing an ethylene-vinyl acetate copolymer as a main component and to a solar battery prepared by using the sealing film and particularly relates to a sealing film for a solar battery having an excellent anti-yellowing property.

BACKGROUND ART

In recent years, from the viewpoint of the effective utilization of resources, the prevention of environmental pollution, or the like, solar batteries that directly convert sunlight into electric energy have received attention, and the development of the solar batteries has been pursued.

A solar battery generally has a configuration in which cells 4 for a solar battery, such as silicon power devices, are sealed with sealing films 3A and 3B, which are EVA (ethylene-vinyl acetate copolymer) films, between a glass substrate as a front side transparent protective member 1 and a back side protective member (back cover) 2, as illustrated in FIG. 1. Hereinafter, a sealing film that is disposed in the light receiving surface side of the cells is referred to as "front side sealing film" and a sealing film that is disposed in the back side of the cells is referred to as "back side sealing film."

The front side transparent protective member 1, the front side sealing film 3A, the cells 4 for a solar battery, the back side sealing film 3B, and the back side protective member 2 are layered in this order, heated and pressurized, and adhesively integrated by crosslinking and curing the EVA, to manufacture such a solar battery.

In accordance with the above-described solar battery, it is strongly desired to enable light incident on the solar battery to be taken into the cells for a solar battery as efficiently as possible from the viewpoint of improving power generation efficiency. Thus, the EVA films for sealing, which have maximum transparency and do not absorb or reflect incident sunlight and through which the sunlight almost passes, are desirable.

However, the occurrence of the phenomenon of yellowing EVA films for sealing to decrease a sunlight transmittance due to the influence of light and heat, when a solar battery is used for a long term, and poor appearance caused by the yellowing have become problems.

For these problems, there have been disclosed the measures of using various additives such as various organic peroxides and ultraviolet absorbers together in EVA films for sealing, and the like. For example, in Patent Document 1, 2,5-dimethyl-2,5-di(t-butylperoxy)hexane, which is a peroxyester-based peroxide, is used as an organic peroxide (crosslinking agent), and 2-hydroxy-4-n-octoxybenzophenone, based on monohydroxyalkoxybenzophenone, is used as an ultraviolet absorber. In addition, in Patent Document 2, 1,1-bis(t-butylperoxy)3,3,5-trimethylcyclohexane is used as an organic peroxide, and 2-hydroxy-4-n-octoxybenzophenone, which is the same as described above, is used as an ultraviolet absorber.

RELATED ART DOCUMENTS

Patent Documents

Patent Document 1: Japanese Unexamined Patent Application Publication No. 08-139347

Patent Document 2: Japanese Unexamined Patent Application Publication No. 2000-183381

SUMMARY OF INVENTION

Problems to be Solved by the Invention

However, there has been still a problem that, in solar batteries prepared by using the conventional EVA films for sealing, the EVA films for sealing are yellowed to result in degradation in electric power generation performance when they are used for a long term.

The benzophenone-based ultraviolet absorber is proposed in Patent Document 1 or 2, there is a situation in which, although stabilization effect is exhibited, the lives of the sealing films are shorter than those of the solar battery cells and, as a result, the life of the solar battery depends on the lives of the sealing films, and further stabilization is thus demanded for the proliferation of solar batteries.

Thus, an object of the present invention is to provide a sealing film for a solar battery which has excellent light resistance and heat resistance by preventing yellowing due to the influence of light or heat.

Means for Solving the Problems

As a result of performing various examinations with respect to the above-described problems, the present inventors found that use of a hindered amine-based light stabilizer having a specific structure in a film comprising an ethylene-vinyl acetate copolymer can remarkably improve light resistance in comparison with the case of using hindered amine-based light stabilizers which are conventionally considered to be preferable, and the present invention was thus accomplished.

That is, a sealing film for a solar battery according to the present invention is one in which 0.05-10 parts by weight of a hindered amine compound having a substructure represented by the following general formula (I):

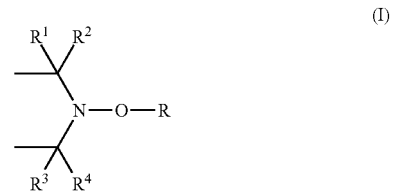

(wherein $R^1$, $R^2$, $R^3$, and $R^4$ each independently represent $C_1$-$C_4$ lower alkyl; and R represents hydrogen, $C_1$-$C_{18}$ straight- or branched-chain alkyl which may be substituted by hydroxy, or $C_5$-$C_8$ cycloalkyl) based on 100 parts by weight of an ethylene-vinyl acetate copolymer is blended.

The sealing film for a solar battery according to the present invention is preferably one, wherein the hindered amine compound is a hindered amine compound having a 2,2,6,6-tetramethylpiperidine structure represented by the following general formula (II):

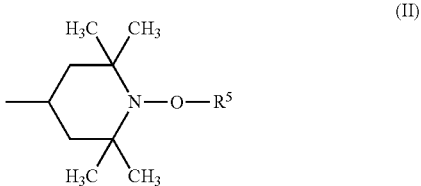

(wherein $R^5$ represents $C_1$-$C_{18}$ straight- or branched-chain alkyl which may be substituted by hydroxy or $C_5$-$C_8$ cycloalkyl).

In addition, the sealing film for a solar battery according to the present invention is preferably one, wherein the hindered amine compound is a compound represented by the following general formula (III):

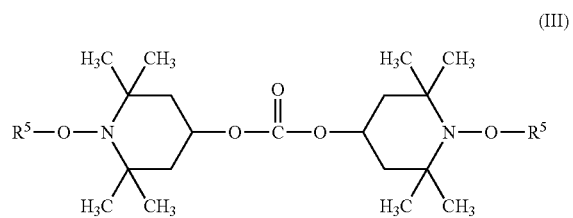

(wherein $R^5$ represents $C_1$-$C_{18}$ straight- or branched-chain alkyl which may be substituted by hydroxy or $C_5$-$C_8$ cycloalkyl).

Furthermore, the sealing film for a solar battery according to the present invention is preferably one, wherein the hindered amine compound is represented by the following general formula (IV):

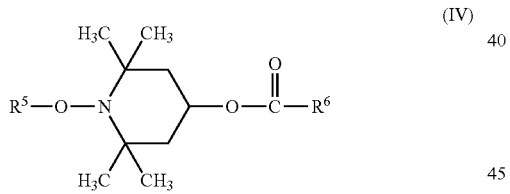

(wherein $R^5$ represents $C_1$-$C_{18}$ straight- or branched-chain alkyl which may be substituted by hydroxy or $C_5$-$C_8$ cycloalkyl; and $R^6$ represents $C_1$-$C_{20}$ alkyl).

A solar battery according to the present invention is one, in which the solar battery sealing film according to claim 1 is used in any one or both of a front side sealing film and a back side sealing film.

Effects of the Invention

In accordance with the present invention, a sealing film for a solar battery having excellent light resistance and heat resistance, in which the occurrence of yellowing or the like is remarkably suppressed even in its use for a long term, can be provided. Furthermore, the sealing film for a solar battery can maintain a high ultraviolet ray absorption for a long term and suppress degradation of, e.g., cells included in a solar battery. Thus, a solar battery prepared by using such a sealing film for a solar battery is also excellent in light resistance and heat resistance.

BRIEF DESCRIPTION OF THE DRAWINGS

FIG. 1 is a schematic explanation view of a general solar battery.

MODES FOR CARRYING OUT THE INVENTION

Preferred embodiments of the sealing film for a solar battery according to the present invention will be enumerated below.

The ethylene-vinyl acetate copolymer used in accordance with the present invention preferably has a vinyl acetate unit of 10-30 parts by mass, more preferably 10-28 parts by mass, and particularly preferably 22-28 parts by mass. When this vinyl acetate content is more than 30 parts by mass, there is a fear that a resin has a decreased viscosity and more easily flows from between a glass substrate and a back cover during sealing. Furthermore, degradation due to light and heat more easily occurs. When the vinyl acetate content is less than 10 parts by mass, there is a fear that processability is deteriorated, an obtained film becomes too much hard, and a degassing property is therefore deteriorated to more easily damage cells during manufacturing a solar battery.

As the hindered amine compound used in accordance with the present invention, the hindered amine-based compound having the substructure represented by the following general formula (I) is preferably used, the compound having the substructure represented by the following general formula (II) is preferred because of having excellent weather resistance, and the compound having the structure represented by the following general formula (III) or (IV) is particularly preferred because of exhibiting a remarkable stabilization effect:

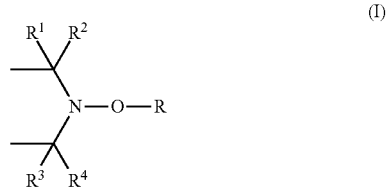

(wherein $R^1$, $R^2$, $R^3$, and $R^4$ each independently represent $C_1$-$C_4$ lower alkyl; and R represents hydrogen, $C_1$-$C_{18}$ straight- or branched-chain alkyl which may be substituted by hydroxy, or $C_5$-$C_8$ cycloalkyl);

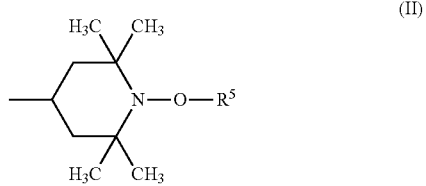

(wherein $R^5$ represents $C_1$-$C_{18}$ straight- or branched-chain alkyl which may be substituted by hydroxy or $C_5$-$C_8$ cycloalkyl);

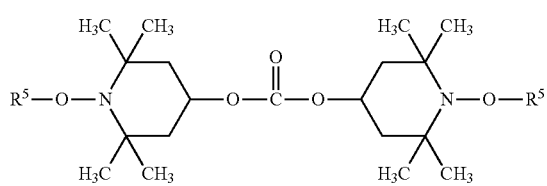

(III)

(wherein $R^5$ represents $C_1$-$C_{18}$ straight- or branched-chain alkyl which may be substituted by hydroxy or $C_5$-$C_8$ cycloalkyl); and

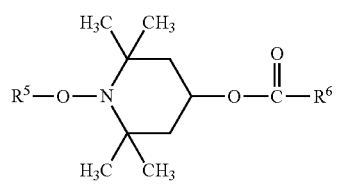

(IV)

(wherein $R^5$ represents $C_1$-$C_{18}$ straight- or branched-chain alkyl which may be substituted by hydroxy or $C_5$-$C_8$ cycloalkyl; and $R^6$ represents $C_1$-$C_{20}$ alkyl).

$C_1$-$C_4$ lower alkyl groups represented by the above-described $R^1$, $R^2$, $R^3$, and $R^4$ include methyl, ethyl, propyl, and butyl groups.

$C_1$-$C_{18}$ straight- or branched-chain alkyl groups which may be substituted by hydroxy, represented by the above-described $R^5$, include methyl, ethyl, propyl, isopropyl, butyl, secondary butyl, tertiary butyl, isobutyl, pentyl, isopentyl, tertiary pentyl, hexyl, heptyl, n-octyl, isooctyl, tertiary octyl, nonyl, isononyl, decyl, undecyl, dodecyl, tridecyl, tetradecyl, pentadecyl, hexadecyl, heptadecyl, and octadecyl groups, etc. These alkyl groups may also be substituted by cycloalkyl.

$C_5$-$C_8$ cycloalkyl groups represented by the above-described $R^6$ include cyclopentyl, cyclohexyl, cycloheptyl, and cyclooctyl groups. They may also be substituted by alkyl, etc.

Compounds having substructures represented by the general formula (II) used in accordance with the present invention include, for example, compounds No. 1 to No. 6. In the compound No. 6, n is 2-3.

No. 1

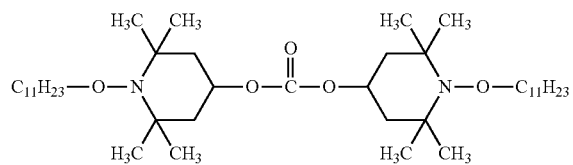

No. 2

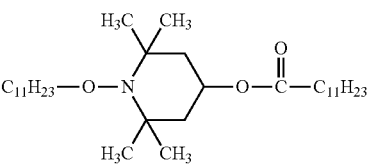

No. 3

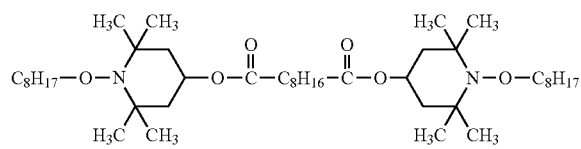

No. 4

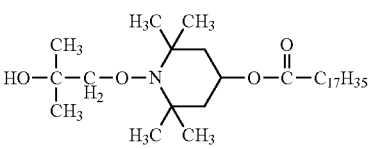

No. 5

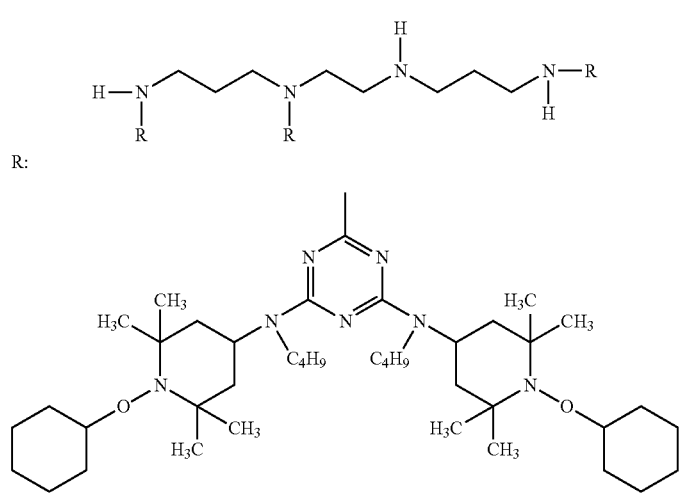

No.6

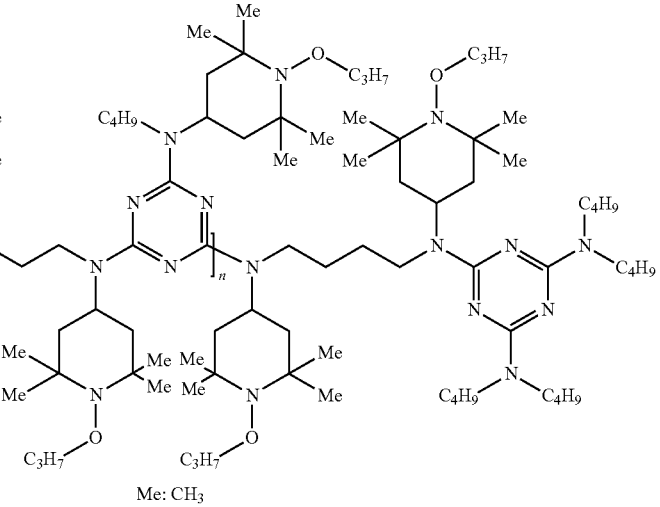

Me: CH₃

The above-described hindered amine compound is preferably used in an amount of 0.05-10 parts by weight, more preferably 0.1-5 parts by weight, particularly preferably 0.2-3 parts by weight, based on 100 parts by weight of the ethylene-vinyl acetate copolymer. Less than 0.05 part by weight results in no stabilization effect whereas use of more than 10 parts by weight results in bad effects such as degradation in transparency of an obtained resin composition, reduction in improvement in stabilization effect by the increment, and increase only in cost.

In accordance with the present invention, it is preferable to further use a crosslinking agent in addition to the above-described ethylene-vinyl acetate copolymer, and a peroxide or the like is used as the crosslinking agent. Peroxides used include: 2,5-dimethylhexane; 2,5-dihydroperoxide; 2,5-dimethyl-2,5-di(tert-butylperoxy)hexane; 3-di-t-butyl peroxide; t-dicumyl peroxide; 2,5-dimethyl-2,5-bis(t-butylperoxy)hexane; 2,5-dimethyl-2,5-di(tert-butylperoxy)hexyne; dicumyl peroxide; t-butyl cumyl peroxide; α,α'-bis(tert-butylperoxyisopropyl)benzene; α,α'-bis(tert-butylperoxy)diisopropylbenzene; n-butyl-4,4-bis(t-butylperoxy)butane; 2,2-bis(tert-butylperoxy)butane; 1,1-bis(t-butylperoxy)cyclohexane; 1,1-bis(tert-butylperoxy)3,3,5-trimethylcyclohexane; tert-butyl peroxybenzoate; benzoyl peroxide; and the like.

Generally, in the production of a sealing film using an ethylene-vinyl acetate copolymer, a crosslinking agent such as the above-described organic peroxides is used to improve the crosslink density of a monomer. However, the use of the organic peroxide results in remaining of a reaction residue and an unreacted matter in a sealing film while improving a crosslink density to enable improvement in light resistance. Since such a residue is unstable, the residue is easily decomposed to generate radicals when the sealing film containing the residue is irradiated with light including ultraviolet rays or is heated for a long term, and, once the radicals are generated, new radicals are generated in a series to result in yellowing due to the oxidative degradation of polymers and the generation of conjugated double bonds.

Thus, in the sealing film for a solar battery according to the present invention, the contents of a hindered amine-based light stabilizer having a specific structure and an organic peroxide used as a crosslinking agent in an ethylene-vinyl acetate copolymer film are preferably optimized.

In the sealing film for a solar battery according to the present invention, the content of the organic peroxide is 0.2-1.8 parts by mass, preferably 0.25-1.7 parts by mass, more preferably 0.3-1.5 parts by mass, based on 100 parts by mass of the ethylene-vinyl acetate copolymer. As a result, the reaction residue and unreacted matter of the organic peroxide can be inhibited from remaining in the sealing film. In addition, there is a fear that time for which the sealing film is crosslinked and cured becomes longer than required when the content of the organic peroxide is less than 0.2 part by mass.

As the organic peroxide used for the sealing film for a solar battery according to the present invention, any organic peroxides that decompose at temperatures of 100° C. or more to generate radicals may be used. The organic peroxide is generally selected in consideration of film formation temperature, the conditions of adjusting a composition, curing temperature, the heat resistance of an adherend, and storage stability. Particularly, an organic peroxide having a half life of 10 hours and a decomposition temperature of 70° C. or more is preferred.

In the sealing film for a solar battery according to the present invention, the above-described hindered amine-based light stabilizer and ultraviolet absorber are preferably used together to improve weather resistance. The ultraviolet absorber used is not particularly limited if it is known in the art. For example, benzophenone-, benzotriazole-, triazine-, salicylate-, and cyanoacrylate-based ultraviolet absorbers may be used. One of them may be used or two or more thereof may be used in combination.

The benzophenone-based ultraviolet absorbers include, for example, 2,2'-dihydroxy-4,4'-di(hydroxymethyl)benzophenone, 2,2'-dihydroxy-4,4'-di(2-hydroxyethyl)benzophenone, 2,2'-dihydroxy-3,3'-dimethoxy-5,5'-di(hydroxymethyl)benzophenone, 2,2'-dihydroxy-3,3'-dimethoxy-5,5'-di(2-hydroxyethyl)benzophenone, 2,2'-dihydroxy-3,3'-di(hydroxymethyl)-5,5'-dimethoxybenzophenone, 2,2'-dihydroxy-3,3'-di(2-hydroxyethyl)-5,5'-dimethoxybenzophenone, 2,2-dihydroxy-4,4-dimethoxybenzophenone, and the like.

The benzotriazole-based ultraviolet absorbers include, for example, 2-[2'-hydroxy-5'-(hydroxymethyl)phenyl]-2H- benzotriazole, 2-[2'-hydroxy-5'-(2-hydroxyethyl)phenyl]-2H-benzotriazole, 2-[2'-hydroxy-5'-(3-hydroxypropyl)phenyl]-2H-benzotriazole, 2-[2'-hydroxy-3'-methyl-5'-(hydroxymethyl)phenyl]-2H-benzotriazole, 2-[2'-hydroxy-3'-methyl-5'-(2-hydroxyethyl)phenyl]-2H-benzotriazole, 2-[2'-hydroxy-3'-methyl-5'-(3-hydroxypropyl)phenyl]-2H-benzotriazole, 2-[2'-hydroxy-3'-t-butyl-5'-(hydroxymethyl)phenyl]-2H-benzotriazole, 2-[2'-hydroxy-3'-t-butyl-5'-(2-hydroxyethyl)phenyl]-2H-benzotriazole, 2-[2'-hydroxy-3'-t-butyl-5'-(2-hydroxyethyl)phenyl]-5-chloro-2H-benzotriazole, 2-[2'-hydroxy-3'-t-butyl-5'-(3-hydroxypropyl)phenyl]-2H-benzotriazole, 2-[2'-hydroxy-3'-t-octyl-5'-(hydroxymethyl)phenyl]-2H-benzotriazole, 2-[2'-hydroxy-3'-t-octyl-5'-(2-hydroxyethyl)phenyl]-2H-benzotriazole, 2-[2'-hydroxy-3'-t-octyl-5'-(3-hydroxypropyl)phenyl]-2H-benzotriazole, etc., or 2,2'-methylenebis[6-(2H-benzotriazol-2-yl)-4-(hydroxymethyl)phenol], 2,2'-methylenebis[6-(2H-benzotriazol-2-yl)-4-(2-hydroxyethyl)phenol], 2,2'-methylenebis[6-(5-chloro-2H-benzotriazol-2-yl)-4-(2-hydroxyethyl)phenol], 2,2'-methylenebis[6-(5-bromo-2H-benzotriazol-2-yl)-4-(2-hydroxyethyl)phenol], 2,2'-methylenebis[6-(2H-benzotriazol-2-yl)-4-(3-hydroxypropyl)phenol], 2,2'-methylenebis[6-(5-chloro-2H-benzotriazol-2-yl)-4-(3-hydroxypropyl)phenol], 2,2'-methylenebis[6-(5-bromo-2H-benzotriazol-2-yl)-4-(3-hydroxypropyl)phenol], 2,2'-methylenebis[6-(2H-benzotriazol-2-yl)-4-(4-hydroxybutyl)phenol], 2,2'-methylenebis[6-(5-chloro-2H-benzotriazol-2-yl)-4-(4-hydroxybutyl)phenol], 2,2'-methylenebis[6-(5-bromo-2H-benzotriazol-2-yl)-4-(4-hydroxybutyl)phenol], 3,3-{2,2'-bis[6-(2H-benzotriazol-2-yl)-1-hydroxy-4-(2-hydroxyethyl)phenyl]}propane, 2,2-{2,2'-bis[6-(2H-benzotriazol-2-yl)-1-hydroxy-4-(2-hydroxyethyl)phenyl]}butane, 2,2'-oxybis[6-(2H-benzotriazol-2-yl)-4-(2-hydroxyethyl)phenol], 2,2'-bis[6-(2H-benzotriazol-2-yl)-4-(2-hydroxyethyl)phenol]sulfide, 2,2'-bis[6-(2H-benzotriazol-2-yl)-4-(2-hydroxyethyl)phenol]sulfoxide, 2,2'-bis[6-(2H-benzotriazol-2-yl)-4-(2-hydroxyethyl)phenol]sulfone, 2,2'-bis[6-(2H-benzotriazol-2-yl)-4-(2-hydroxyethyl)phenol]amine, etc.

The triazine-based ultraviolet absorbers include, for example, 2-(2-hydroxy-4-hydroxymethylphenyl)-4,6-diphenyl-s-triazine, 2-(2-hydroxy-4-hydroxymethylphenyl)-4,6-bis(2,4-dimethylphenyl)-s-triazine, 2-[2-hydroxy-4-(2-hydroxyethyl)phenyl]-4,6-diphenyl-s-triazine, 2-[2-hydroxy-4-(2-hydroxyethyl)phenyl]-4,6-bis(2,4-dimethylphenyl)-s-triazine, 2-[2-hydroxy-4-(2-hydroxyethoxy)phenyl]-4,6-diphenyl-s-triazine, 2-[2-hydroxy-4-(2-hydroxyethoxy)phenyl]-4,6-bis(2,4-dimethylphenye-s-triazine, 2-[2-hydroxy-4-(3-hydroxypropyl)phenyl]-4,6-diphenyl-s-triazine, 2-[2-hydroxy-4-(3-hydroxypropyl)phenyl]-4,6-bis(2,4-dimethylphenyl)-s-triazine, 2-[2-hydroxy-4-(3-hydroxypropoxy)phenyl]-4,6-diphenyl-s-triazine, 2-[2-hydroxy-4-(3-hydroxypropoxy)phenyl]-4,6-bis(2,4-dimethylphenyl)-s-triazine, 2-[2-hydroxy-4-(4-hydroxybutyl)phenyl]-4,6-diphenyl-s-triazine, 2-[2-hydroxy-4-(4-hydroxybutyl)phenyl]-4,6-bis(2,4-dimethylphenyl)-s-triazine, 2-[2-hydroxy-4-(4-hydroxybutoxy)phenyl]-4,6-diphenyl-s-triazine, 2-[2-hydroxy-4-(4-hydroxybutoxy)phenyl]-4,6-bis(2,4-dimethylphenyl)-s-triazine, 2-(2-hydroxy-4-hexyloxyphenyl)-4,6-diphenyl-s-triazine, 2-[2-hydroxy-4-(2-ethylhexyloxy)phenyl]-4,6-(2,4-dimethylphenyl)-s-triazine, 2-[2-hydroxy-4-{2-(2-ethylhexyloxy)ethyl}phenyl]-4,6-diphenyl-s-triazine, 2-(2-hydroxy-4-hydroxymethylphenyl)-4,6-bis(2-hydroxy-4-methylphenyl)-s-triazine, 2-[2-hydroxy-4-(2-hydroxyethyl)phenyl]-4,6-bis(2-hydroxy-4-methylphenyl)-s-triazine, 2-[2-hydroxy-4-(2-hydroxyethoxy)phenyl]-4,6-bis(2-hydroxy-4-methylphenyl)-s-triazine, 2-[2-hydroxy-4-(3-hydroxypropyl)phenyl]-4,6-bis(2-hydroxy-4-methylphenyl)-s-triazine, 2-[2-hydroxy-4-(3-hydroxypropoxy)phenyl]-4,6-bis(2-hydroxy-4-methylphenyl)-s-triazine, 2,4,6-tris(2,4-bis(2-hydroxyethyloxy)phenyl)-s-triazine, 2,4,6-tris[2-hydroxy-4-{2-(2-ethylhexanoyloxy)ethyloxy}phenyl]-s-triazine, 2,4,6-tris[2-hydroxy-3-methyl-4-{2-(2-ethylhexanoyloxy)ethyloxy}phenyl]-s-triazine, etc.

The salicylate-based ultraviolet absorbers include phenyl salicylate, p-tert-butylphenyl salicylate, p-octylphenyl salicylate, etc.

The cyanoacrylate-based ultraviolet absorbers include 2-ethylhexyl-2-cyano-3,3'-diphenylacrylate, ethyl-2-cyano-3,3'-diphenylacrylate, tetrakis(2-cyano-3,3'-diphenylacrylate methyl)methane, etc.

In addition, any hindered amine-based light stabilizers except the hindered amine compound having the substructure of the general formula (I) may be used without any particular limitation if they are known in the art.

For example, low-molecular-weight hindered amine-based light stabilizers which can be used together with the hindered amine-based light stabilizer used in accordance with the present invention include a light stabilizer consisting of 70% by weight of reaction product (molecular weight of 737) of decanedioic acid bis(2,2,6,6-tetramethyl-1(octyloxy)-4-piperidinyl)ester, 1,1-dimethylethylhydroperoxide, and octane, and 30% by weight of polypropylene; bis(1,2,2,6,6-pentamethyl-4-piperidyl)[[3,5-bis(1,1-dimethylethyl)-4-hydroxyphenyl]methyl]butylmalonate (molecular weight of 685); a mixture (molecular weight of 509) of bis(1,2,2,6,6-pentamethyl-4-piperidyl)sebacate with methyl-1,2,2,6,6-pentamethyl-4-piperidyl sebacate; bis(2,2,6,6-tetramethyl-4-piperidyl)sebacate (molecular weight of 481); tetrakis(2,2,6,6-tetramethyl-4-piperidyl)-1,2,3,4-butanetetracarboxylate (molecular weight of 791); tetrakis(1,2,2,6,6-pentamethyl-4-piperidyl)-1,2,3,4-butanetetracarboxylate (molecular weight of 847); a mixture (molecular weight of 900) of 2,2,6,6-tetramethyl-4-piperidyl-1,2,3,4-butanetetracarboxylate with tridecyl-1,2,3,4-butanetetracarboxylate; a mixture (molecular weight of 900) of 1,2,2,6,6-pentamethyl-4-piperidyl-1,2,3,4-butanetetracarboxylate with tridecyl-1,2,3,4-butanetetracarboxylate; and the like.

High-molecular-weight hindered amine-based light stabilizers which can be used together with the hindered amine-based light stabilizer used in accordance with the present invention include poly[{6-(1,1,3,3-tetramethylbutyl)amino-1,3,5-triazine-2,4-diyl}{(2,2,6,6-tetramethyl-4-piperidyl)imino}hexamethylene{(2,2,6,6-tetramethyl-4-piperidyl)imino}] (molecular weight of 2,000-3,100); a polymer (molecular weight of 3,100-4,000) of dimethyl succinate and 4-hydroxy-2,2,6,6-tetramethyl-1-piperidine ethanol; a mixture of N,N',N'',N'''-tetrakis-(4,6-bis-(butyl-(N-methyl-2,2,6,6-tetramethylpiperidine-4-yl)amino)-triazine-2-yl)-4,7-diazadecane-1,10-diamine (molecular weight of 2,286) with the above-described polymer of dimethyl succinate and 4-hydroxy-2,2,6,6-tetramethyl-1-piperidine ethanol; a polycondensate (molecular weight 2,600-3,400) of dibutylamine-1,3,5-triazine.N,N'-bis(2,2,6,6-tetramethyl-4-piperidyl-1,6-hexamethylene diamine and N-(2,2,6,6-tetramethyl-4-piperidyl)butylamine; and the like. One of the above-mentioned hindered amine-based light stabilizers may be used alone or two or more thereof may be mixed and used.

The content of a hindered amine-based light stabilizer which can be used together with the above-described hindered amine-based light stabilizer used in accordance with the present invention is 0.1-2.5 parts by mass, more preferably 0.1-1.0 part by mass, based on 100 parts by mass of the ethylene-vinyl acetate copolymer. The content of not less than 0.1 part by mass provides an effect for stabilization, and the content of not more than 2.5 parts by mass can highly prevent the sealing film from being yellowed due to the excessive addition of the hindered amine-based light stabilizer.

The sealing film for a solar battery according to the present invention may also further contain a silane coupling agent for the purpose of improving adhesive strength with a power device. Such silane coupling agents which are used for the purpose may include known agents, for example, γ-chloropropyltrimethoxysilane; vinyltrichlorosilane; vinyltriethoxysilane; vinyl-tris-(β-methoxyethoxy)silane; γ-methacryloxypropyltrimethoxysilane; β-(3,4-ethoxycyclohexyl) ethyltrimethoxysilane; γ-glycidoxypropyltrimethoxysilane; vinyltriacetoxysilane; γ-mercaptopropyltrimethoxysilane; γ-aminopropyltrimethoxysilane; N-β-(aminoethyl)-γ-aminopropyltrimethoxysilane; and the like. The silane coupling agents are used in amounts of not more than 5 parts by mass, preferably 0.1-2 parts by mass, based on 100 parts by mass of the ethylene-vinyl acetate copolymer.

Furthermore, the sealing film for a solar battery according to the present invention preferably contains a cross-linking auxiliary (compound having a radically polymerizable group as a functional group) to improve the gel fraction of the ethylene-vinyl acetate copolymer to improve durability.

Such cross-linking auxiliaries offered for this purpose may include trifunctional cross-linking auxiliaries such as triallyl cyanurate and triallyl isocyanurate as known auxiliaries; monofunctional or bifunctional cross-linking auxiliaries of (meth)acrylic esters (e.g., NK esters, etc.); and the like. The cross-linking auxiliaries are generally used in amounts of not more than 10 parts by mass, preferably 0.1-5 parts by mass, more preferably 0.5-3.5 parts by mass, based on 100 parts by mass of the EVA.

In addition, hydroquinone; hydroquinone monomethyl ether; p-benzoquinone; methyl hydroquinone; and the like may be added for the purpose of improving the stability of the ethylene-vinyl acetate copolymer and are generally used in amounts of not more than 5 parts by mass based on 100 parts by weight of the ethylene-vinyl acetate copolymer.

A coloring agent, an antioxidant, an antitarnish agent, and the like may further be added to the sealing film for a solar battery according to the present invention, as needed. Examples of the coloring agent are inorganic pigments such as metal oxides and metal powders; and organic pigments such as azo, phthalocyanine, azi, acid or basic dye lakes. Such antioxidants may include amine-based, phenol-based, and bisphenyl-based antioxidants.

The thickness of the sealing film for a solar battery according to the present invention is, but is not limited to, preferably from 20 μm to 2 mm.

The sealing film for a solar battery according to the present invention can be produced according to a usual method, such as, for example, film formation by heat rolling of a composition containing various components by extrusion molding, calendering, or the like. A sheet-like matter can also be obtained by dissolving the composition in a solvent, applying this solution onto an appropriate substrate with an appropriate applicator (coater), and drying it to form a coating film. Heating temperature is generally 50-90° C.

In accordance with the present invention, a sealing film for a solar battery with yellowing inhibited from occurring and excellent light resistance, heat resistance, and weather resistance can be formed. Thus, a solar battery that can efficiently take incident light in cells for a solar battery and is excellent in power generation efficiency even if it is installed under severe environment such as the outdoors vulnerable to light and heat for a long term can be achieved by using such a sealing film in the solar battery.

To manufacture the solar battery using the sealing film for a solar battery according to the present invention, when the front side transparent protective member 1, the front side sealing film 3A, the cells 4 for a solar battery, the back side sealing film 3B, and the back side protective member 2 are layered as illustrated in FIG. 1, it is preferable to perform the layering using the sealing film according to the present invention in at least one of the front side sealing film and the back side sealing film and to seal the layered product by heating and pressurization with a vacuum laminator according to a usual method at a temperature of 120-150° C., for degassing time of 2-15 minutes, at a press pressure of 0.5-1 kg/cm$^2$, and for press time of 8-45 minutes.

The front side transparent protective member, the back side protective member, and the cells for a solar battery can be integrated via the front side sealing film and the back side sealing film to seal the cells for a solar battery by crosslinking the ethylene-vinyl acetate copolymer contained in the front side sealing film and the back side sealing film during the heating and the pressurization.

In the solar battery, the sealing film according to the present invention is used in at least one of the front side sealing film and the back side sealing film; however, since yellowing based on degradation due to light and heat can highly be suppressed for a long term, it is preferably used as at least the front side sealing film and more preferably used in both of the front side sealing film and the back side sealing film.

The front side transparent protective member used with the sealing film for a solar battery according to the present invention is usually silicate glass. A glass sheet generally has a thickness of 0.1-10 mm, preferably 0.3-5 mm. The glass substrate is generally chemically or thermally strengthened.

The back side protective member used with the sealing film for a solar battery according to the present invention is generally a plastics film (e.g., polyethylene terephthalate (PET), polytetrafluoroethylene (PTFE)) and preferably a fluorinated polyethylene film in consideration of heat resistance.

The members except the sealing films, such as the front side transparent protective member, the back side protective member, and the cells for a solar battery, preferably have configurations similar to those of the solar batteries known in the art and are not particularly limited.

EXAMPLES

The present invention will be described below with reference to Examples. The present invention is not limited to Examples below.

Examples 1-1 to 1-9 and Comparative Examples 1-1 to 1-8)

Using compositions blended as described below, calendering was performed at 80° C. to form EVA films. The films had a thickness of 500 μm.

| | |
|---|---|
| Ethylene-vinyl acetate copolymer (containing 25 mass % of vinyl acetate) | 100 parts by mass |
| Organic peroxide *1 | 0.5 part by mass |
| Hindered amine compound (listed in Table 1) | 0.3 part by mass |
| Ultraviolet absorber (listed in Table 1) | 0.3 part by mass |
| Phenolic antioxidant *2 | 0.1 part by mass |

-continued

| | |
|---|---|
| Phosphoric antioxidant *3 | 0.1 part by mass |
| Calcium stearate | 0.05 part by mass |

*1: 2,5-dimethyl-2,5-bis(t-butylperoxy)hexane
*2: tetrakis(3-(3,5-di-tert-butyl-4-hydroxyphenyl)propionyloxymethyl)methane
*3: tris(2,4-di-tert-butylphenyl)phosphite

[Evaluation by Rupture Time]

With Sunshine Weather-O-Meter (black-panel temperature of 63° C., without water spray), the degradation of the obtained EVA films was accelerated to measure the time before rupture every 120 hours. The results are listed in Table 1 as described below.

25 mass % of vinyl acetate) was replaced by an ethylene-vinyl acetate copolymer (containing 6 mass % of vinyl acetate). A hindered amine compound and an ultraviolet absorber, listed in Table 2 as described below, were blended.

[Evaluation by Carbonyl Index]

The EVA films (size of 50×50 mm) obtained in Example 2 were sandwiched between float glasses (thickness of 3 mm, size of 50×50 mm), degassed under 100° C. for 5 minutes, thereafter pressed at 10 kPa for 10 minutes to perform pre-molding, and then heated and pressurized at 160° C. to pro-

TABLE 1

| | Hindered Amine Compound | | Ultraviolet Absorber | | Rupture Time (h) |
|---|---|---|---|---|---|
| | Compound | Part(s) by Mass | Compound | Part(s) by Mass | |
| Example | | | | | |
| 1-1 | No. 1 | 0.1 | UVA-1*[4] | 0.3 | 2040 |
| 1-2 | No. 1 | 0.3 | — | — | 2760 |
| 1-3 | No. 1 | 0.3 | UVA-1*[4] | 0.1 | 3600 |
| 1-4 | No. 1 | 0.3 | UVA-1*[4] | 0.3 | 4320 |
| 1-5 | No. 1 | 0.3 | UVA-1*[4] | 1.0 | 4680 |
| 1-6 | No. 1 | 0.3 | Compound 11*[5] | 0.3 | 4080 |
| 1-7 | No. 1 | 1.0 | UVA-1*[4] | 0.3 | 6120 |
| 1-8 | No. 3 | 0.3 | UVA-1*[4] | 0.3 | 3720 |
| 1-9 | No. 4 | 0.3 | UVA-1*[4] | 0.3 | 3840 |
| Comparative Example | | | | | |
| 1-1 | — | — | — | — | 1320 |
| 1-2 | Comparative Compound 1*[6] | 0.3 | — | — | 1680 |
| 1-3 | Comparative Compound 1*[6] | 0.3 | UVA-1*[4] | 0.3 | 1920 |
| 1-4 | Comparative Compound 2*[7] | 0.3 | UVA-1*[4] | 0.3 | 2280 |
| 1-5 | Comparative Compound 3*[8] | 0.3 | UVA-1*[4] | 0.3 | 2040 |
| 1-6 | No. 1 | 0.01 | UVA-1*[4] | 0.3 | 1440 |
| 1-7 | No. 1 | 20 | UVA-1*[4] | 0.3 | 6720 |
| 1-8 | — | — | UVA-1*[4] | 0.3 | 1440 |

*4: tris(2-hydroxy-3-methyl-4-(2-ethylhexanoyloxy)phenyl-s-triazine
*5: 2,4-dihydroxybenzophenone
*6: (2,2,6,6-tetramethyl-4-piperidyl)sebacate
*7: (1,2,2,6,6-pentamethyl-4-piperidyl)sebacate
*8: 1,6-bis(2,2,6,6-tetramethyl-4-piperidylamino)hexane/2,4-dichloro-6-tert-octylamino-s-triazine polycondensate Examples 2-1 to 2-9 and Comparative Examples 2-1 to 2-8

Films were obtained in the same manner as in Example 1-1 except that the ethylene-vinyl acetate copolymer (containing duce samples for measuring weather resistance. For the samples for measuring weather resistance, time before each carbonyl index exceeded 1.0 was measured with Sunshine Weather-O-Meter (black-panel temperature of 63° C., without water spray) every 120 hours.

TABLE 2

| | Hindered Amine Compound | | Ultraviolet Absorber | | Carbonyl Index ≥ 1 (h) |
|---|---|---|---|---|---|
| | Compound | Part(s) by Mass | Compound | Part(s) by Mass | |
| Example | | | | | |
| 2-1 | No. 1 | 0.1 | UVA-1*[4] | 0.3 | 1800 |
| 2-2 | No. 1 | 0.3 | — | — | 2400 |
| 2-3 | No. 1 | 0.3 | UVA-1*[4] | 0.1 | 2640 |
| 2-4 | No. 1 | 0.3 | UVA-1*[4] | 0.3 | 2880 |
| 2-5 | No. 1 | 0.3 | UVA-1*[4] | 1.0 | 3240 |
| 2-6 | No. 1 | 0.3 | Compound 11*[5] | 0.3 | 2760 |
| 2-7 | No. 1 | 1.0 | UVA-1*[4] | 0.3 | 3720 |

TABLE 2-continued

| | Hindered Amine Compound | | Ultraviolet Absorber | | |
|---|---|---|---|---|---|
| | Compound | Part(s) by Mass | Compound | Part(s) by Mass | Carbonyl Index ≥ 1 (h) |
| 2-8 | No. 3 | 0.3 | UVA-1*[4] | 0.3 | 2640 |
| 2-9 | No. 4 | 0.3 | UVA-1*[4] | 0.3 | 2760 |
| Comparative Example | | | | | |
| 2-1 | — | — | — | — | 360 |
| 2-2 | Comparative Compound 1*[6] | 0.3 | — | — | 960 |
| 2-3 | Comparative Compound 1*[6] | 0.3 | UVA-1*[4] | 0.3 | 1200 |
| 2-4 | Comparative Compound 2*[7] | 0.3 | UVA-1*[4] | 0.3 | 1680 |
| 2-5 | Comparative Compound 3*[8] | 0.3 | UVA-1*[4] | 0.3 | 1920 |
| 2-6 | No. 1 | 0.01 | UVA-1*[4] | 0.3 | 600 |
| 2-7 | No. 1 | 20 | UVA-1*[4] | 0.3 | 4080 |
| 2-8 | — | — | UVA-1*[4] | 0.3 | 480 |

*[4]: tris(2-hydroxy-3-methyl-4-(2-ethylhexanoyloxy)phenyl-s-triazine
*[5]: 2,4-dihydroxybenzophenone
*[6]: (2,2,6,6-tetramethyl-4-piperidyl)sebacate
*[7]: (1,2,2,6,6-pentamethyl-4-piperidyl)sebacate
*[8]: 1,6-bis(2,2,6,6-tetramethyl-4-piperidylamino)hexane/2,4-dichloro-6-tert-octylamino-s-triazine polycondensate In Comparative Examples 1-7, the molding was possible, but viscous eruptions were present on film surfaces and there was a problem in workability during producing the samples for measuring weather resistance.

REFERENCE SIGNS LIST

1 Front side transparent protective member
2 Back side protective member
3A Front side sealing film
3B Back side sealing film
4 Cell for solar battery

The invention claimed is:

1. A solar battery comprising a sealing film which comprises ethylene-vinyl acetate copolymer, 0.2 to 1.8 parts by weight of one or more organic peroxides and 0.05-10 parts by weight of a hindered amine compound having a structure represented by at least one of the following formulas:

No. 4

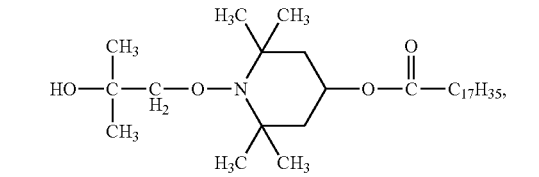

No. 5

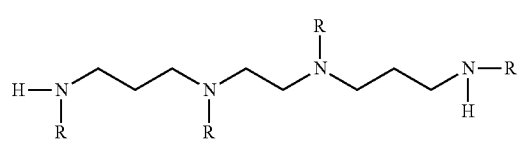

R:

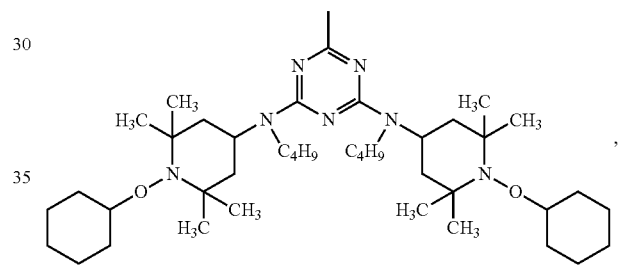

-continued and

No. 6

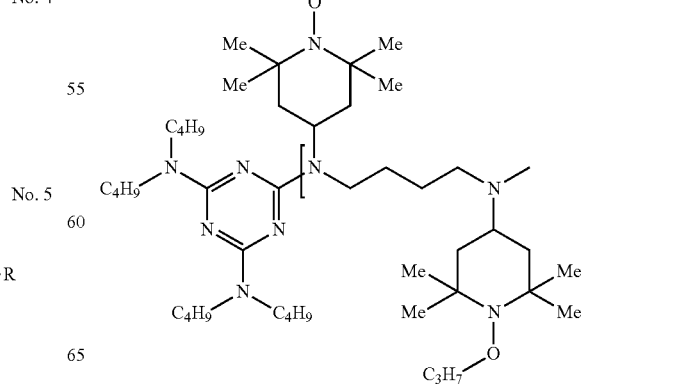

-continued

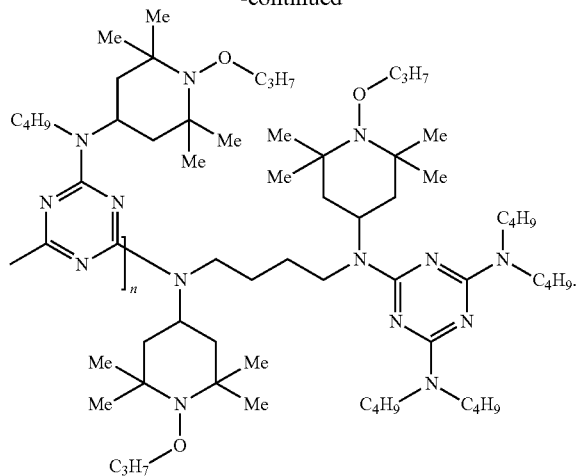

Me: CH₃

2. The solar battery according to claim 1, wherein the solar battery further comprises any one or both of a front side sealing film and a back side sealing film comprising the sealing film.

3. A solar battery comprising a sealing film which comprises ethylene-vinyl acetate copolymer, 0.2 to 1.8 parts by weight of one or more organic peroxides and 0.05-10 parts by weight of a hindered amine compound having a structure represented by the following general formula (III):

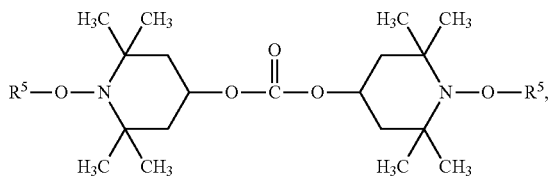

(III)

wherein $R^5$ represents $C_1$-$C_{18}$ straight- or branched-chain alkyl which may be substituted by hydroxy or $C_5$-$C_8$ cycloalkyl.

4. The solar battery according to claim 3, wherein the hindered amine has the following structure:

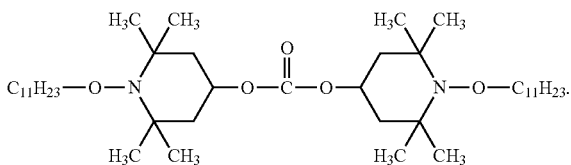

No. 1

5. The solar battery according to claim 3, wherein the solar battery further comprises any one or both of a front side sealing film and a back side sealing film comprising the sealing film.

* * * * *